United States Patent [19]

Smolko

[11] 4,188,652
[45] Feb. 12, 1980

[54] ELECTRONIC DEVICE

[76] Inventor: Gennady G. Smolko, 103482 korpus 501, kv. 19, Moscow, U.S.S.R.

[21] Appl. No.: 870,174

[22] Filed: Jan. 17, 1978

[51] Int. Cl.² .......................................... H01L 19/00
[52] U.S. Cl. ..................................... 361/402; 428/901
[58] Field of Search ...................... 361/402, 274, 387; 427/96; 428/901; 179/52 S, 52 R, 68.5; 357/4

[56] References Cited

U.S. PATENT DOCUMENTS

| 3,165,672 | 1/1965 | Gellert | 361/387 |
| 3,268,778 | 8/1966 | Worsham | 174/68.5 |
| 3,611,096 | 10/1971 | Covert | 361/387 |
| 3,895,272 | 7/1975 | Smolko | 361/274 |
| 4,074,419 | 2/1978 | Hanni et al. | 174/68.5 |

Primary Examiner—David Smith, Jr.
Attorney, Agent, or Firm—Lackenbach, Lilling & Siegel

[57] ABSTRACT

An electronic device comprising a case made of a metal of the valve group. A texturized anode oxide film obtained from the metal of the case is formed on the surface layer of the metal of the case on its inner side. The surface of the film carries a film integrated microcircuit.

9 Claims, 2 Drawing Figures

ELECTRONIC DEVICE

FIELD OF THE INVENTION

This invention relates to the field of electronics and more particularly to electronic devices.

The invention can be used to advantage in electronic calculators, electronic watches, radio and TV sets, and measuring instruments.

DESCRIPTION OF THE PRIOR ART

Known in the art are microcircuits comprising a substrate of a metal of the valve group with an anode oxide film surface layer accomodating the microcircuit elements: the current-carrying paths, contact areas, resistors, capacitors and attached elements (see, for instance, U.S. Pat. No. 3,895,272).

Also known are electronic devices comprising a case and a separate dielectric substrate carrying a film integrated microcircuit (see, for example, France Pat. No. 2213538 Class G06 1/08).

The case of said electronic devices is made of a dielectric material—glass, ceramic, plastic. The dielectric substrate made of glass, ceramic or plastic material carrying the film integrated microcircuit is fixed by a known means, for example, by cementing, to the case of the device. In this case, the substrate is always dielectrically isolated from the case.

This leads to a low reliability of the known electronic devices since glass, ceramic and other similar materials are of rather low mechanical and thermal resistance and their low heat conductivity does not ensure a sufficiently reliable removal of heat from the microcircuit elements, thus requiring the employment of special accessories to maintain the specified duty conditions of the microcircuit. Moreover, the use of heterogenous materials in the case-substrate-microcircuit system presents an additional risk of failure of the device in service.

The manufacture of such electronic devices makes it necessary to carry out supplementary technological operations to fix the substrate to the case of the device.

The above disadvantages cannot be eliminated or minimized even by employing the microcircuit described in U.S. Pat. No. 3,895,272 as a substrate accomodating the circuit elements.

SUMMARY OF THE INVENTION

It is an object of the present invention to improve the service reliability of electronic apparatus.

It is another object of the present invention to simplify the process of manufacture of electronic apparatus.

This object is achieved by developing an electronic device, the inner surface of which has a dielectric substrate carrying a film integrated microcircuit. This case of the device is made of a metal of the valve group, and the dielectric substrate is a texturized anode oxide film obtained from the metal of the body and formed on the surface layer of the metal.

Such an embodiment of the electronic device provides for a homogeneity of the material of the case, substrate and elements of the film integral microcircuit, reliable removal of the heat given up by the microcircuit elements and high mechanical and thermal resistance of the entire device, thereby ensuring a high service reliability of the electronic device.

BRIEF DESCRIPTION OF DRAWINGS

These and other objects of the present invention will be made more apparent as this description proceeds, particularly when considered in connection with the accompanying drawings, wherein.

DETAILED DESCRIPTION OF THE INVENTION

An electronic calculator will be further described as an example of a specific embodiment of the present invention.

Figure 1:
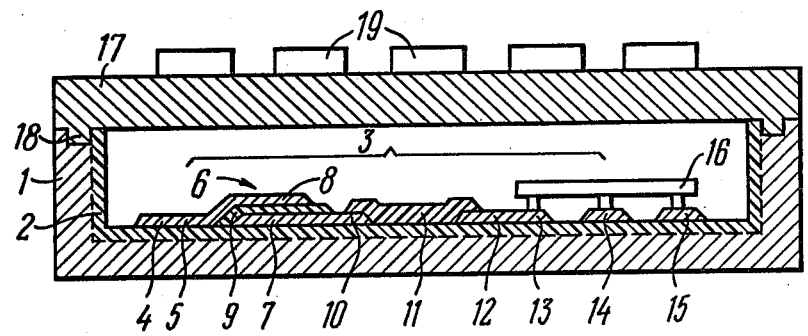
FIG. 1 is an enlarged cross-sectional view of an electronic device according to the invention.

The hereinproposed electronic device comprises a case 1 (FIG. 1). The case 1 is made of a metal of the valve group, for example, of aluminium. (A "valve" metal is a metal whose oxide film features one-way conductance.) Titanium, tantalum, niobium, nickel and tin may be used besides aluminium.

The inner surface of the case 1 has a dielectric substrate 2. The substrate 2 is a texturized anode oxide film. The film 2 is obtained from (made integrally with) the metal of the case 1, i.e., from the aluminium, and is formed on the surface layer of the mentioned metal (the boundary between the film 2 and the metal proper is shown in the drawing arbitrarily by a dashed line).

The film integrated microcircuit 3 is made on the texturized anode oxide film 2. The microcircuit 3 may have various combinations of circuit elements. FIG. 1 shows a version of the microcircuit 3 containing a contact area 4 connected by a current-carrying path 5 to a capacitor 6 with foils 7 and 8 separated by a dielectric interlayer 9. The capacitor 6 is connected electrically by a current-carrying path 10 to a resistor 11 that is connected, in turn, by a current-carrying path 12 with a contact area 13. The contact areas 13, 14 and 15 hold a microcircuit 16. The contact areas may serve for attaching any other necessary circuit element, for example, a transistor.

The case 1 is provided with a cover 17 made of the same metal as the case 1, i.e., of aluminium, kept within slots 18 of the case 1. The cover may also be made of any other material.

Figure 2:
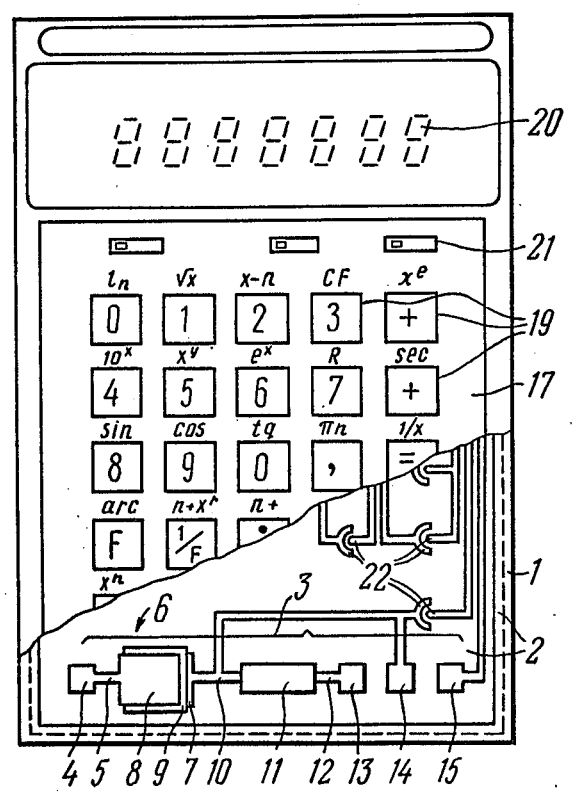
FIG. 2 is a top plan view, partially broken away, of the electronic device, according to the invention.

The cover 17 (FIG. 2) carries the push-buttons 19 of the calculator keyboard for data input, an indicator 20 and a switch 21.

The contacts 22 of the keyboard buttons 19 are arranged on the texturized anode oxide film 2.

The electronic device according to the present invention operates as follows.

Upon connecting the source of electric power supply (not shown in the drawing) to the elements of the film integrated microcircuit 3 (FIG. 1), the dissipated power heats the texturized anode oxide film 2 carrying the elements of the microcircuit 3.

Since the texturized anode oxide film 2 is formed on the metal of the case 1, there are no constructional elements of high thermal resistance between the oxide film 2 and the case 1. Consequently, the heat given up by the elements of the film integrated microcircuit 3 is dissipated by the entire metal mass of the case 1.

As the coefficients of thermal expansion of the metal case 1, texturized anode oxide film 2 and the film integrated microcircuit 3 system are of closely approximating values, even sharp changes in temperature occuring on, for example, switching the device on and off do not give rise to considerable mechanical stresses within the electronic device.

Besides, the mechanical stresses produced on operating the calculator keyboard do not destroy the metal case 1, the textuized anode oxide film 2 or the film integrated microcircuit 3 system since the film 2 is formed in the metal of the case The resulting effect attained by the use of the electronic device according to the present invention provides for a considerable improvement of the service reliability of the device.

The above-described version of the electronic device shows an embodiment used as an electronic calculator. The hereinproposed invention may also be used for electronic watches, radio and TV sets and measuring instruments.

In cases when the cover is made of the same valve-group metal as that of the case, for instance in measuring instruments, the texturized anode oxide film may be formed in the surface layer of the cover metal on the inner side of the surface of the electronic device case, and the elements of the film integrated microcircuit may be arranged on the formed film.

In certain cases as, for example, in TV sets, the case of the electronic device may have partitions. The partitions are made of the same metal as the case of the device, the surface layer of which may be given a texturized anode oxide film also carrying the elements of the film integrated microcircuit.

The proposed electronic device is of high service reliability and is easy to manufacture, thus providing favorable conditions for all-round automation of the manufacturing process of the electronic device.

What is claimed is:

1. An electronic device comprising:
   a boxlike case made of a metal of the valve group and having an inner surface with a surface layer of the same metal;
   a texturized anode oxide film formed in said surface of said metal of said inner surface and obtained from said metal of said case; and
   a film integrated microcircuit formed on said texturized anode oxide film.

2. An electronic device according to claim 1, wherein the case is made of a metal from the group comprising aluminum, titanium, tantalum, niobium, nickel and tin.

3. An electronic device according to claim 2, wherein the case is made of aluminum.

4. An electronic device according to claim 1, wherein the microcircuit comprises: a first contact area positioned on said film; a capacitor with foils; a first current-carrying path connecting said first contact area and said capacitor; a dielectric interlayer separating said foils of said capacitor; a resistor; a second current-carrying path connecting said capacitor and said resistor; a second contact area positioned on said film; and a third current-carrying path connecting said resistor and said second contact area.

5. An electronic device according to claim 4, wherein the microcircuit further comprises third and fourth contact areas positioned on said film; and an additional microcircuit supported on said second, third and fourth contact areas.

6. An electronic device according to claim 1, further comprising partitions in said case made of the same material as said case.

7. An electronic device according to claim 1, further comprising a cover positioned on said case.

8. An electronic device according to claim 7, wherein said cover is made of the same material as said case.

9. An electronic device according to claim 8, wherein said texturized anode oxide film is made on an inside surface of said cover.

* * * * *